United States Patent
Zheng et al.

(10) Patent No.: US 11,009,967 B2
(45) Date of Patent: May 18, 2021

(54) METHOD FOR SCANNING KEYBOARD CIRCUIT

(71) Applicant: Realtek Semiconductor Corporation, Hsinchu (TW)

(72) Inventors: Shi-Wei Zheng, Suzhou (CN); Zuo-Hui Peng, Suzhou (CN); Li Tong, Suzhou (CN); Zhao-Ming Li, Suzhou (CN); Jie-Yu Wang, Suzhou (CN)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 17/032,170

(22) Filed: Sep. 25, 2020

(65) Prior Publication Data

US 2021/0096658 A1 Apr. 1, 2021

(30) Foreign Application Priority Data

Sep. 30, 2019 (CN) .......................... 201910940438.0

(51) Int. Cl.
*G06F 3/023* (2006.01)
*G06F 3/02* (2006.01)
*H03M 11/20* (2006.01)

(52) U.S. Cl.
CPC .......... *G06F 3/0233* (2013.01); *G06F 3/0219* (2013.01); *H03M 11/20* (2013.01)

(58) Field of Classification Search
CPC ..... G06F 3/0219; G06F 3/0233; H03M 11/20
See application file for complete search history.

(56) References Cited

U.S. PATENT DOCUMENTS

| 5,151,554 A * | 9/1992 | Matsuda ................ G10H 1/182 340/2.4 |
| 7,849,240 B2 | 12/2010 | Guan et al. |
| 8,049,646 B2 | 11/2011 | Togashi |

FOREIGN PATENT DOCUMENTS

| CN | 100546202 C | 9/2009 |
| CN | 100550636 C | 10/2009 |
| CN | 102111159 B | 3/2013 |

* cited by examiner

*Primary Examiner* — Priyank J Shah
(74) *Attorney, Agent, or Firm* — Locke Lord LLP; Tim Tingkang Xia, Esq.

(57) ABSTRACT

A method for scanning a keyboard circuit is provided. The keyboard circuit includes a keyboard array, output wires, input wires, and a scanning circuit. Each of the output wires is electrically coupled to a corresponding column of key units of the keyboard array, respectively. Each of the input wires is electrically coupled to a corresponding row of key units of the keyboard array, and is provided with a pull-up resistor. The method includes: turning on and connecting open-drain transistors to the ground in a scanning interval to clean charges on the output wires; turning on the open-drain transistors and connecting the open-drain transistors to the ground sequentially in a scanning duration; and receiving detected electrical levels through the input wires, and when one of the detected electrical levels is substantially equal to the electrical level of the ground, determining that the corresponding key unit is pressed.

10 Claims, 7 Drawing Sheets

301 — turning on the open-drain transistors and connecting the open-drain transistors to the ground by the scanning circuit in a charge-cleaning segment of a scanning interval to clean charges on the output wires 302 — only turning on the open-drain transistors and connecting the open-drain transistors to the ground by the scanning circuit during a respective independent scanning period in a scanning duration in the order of the plurality of columns of key units 303 — receiving detected levels through the input wires by the scanning circuit in the scanning duration, and when one of the detected levels is equal to the level of the ground, determining that the a corresponding key unit of the key units is pressed

METHOD FOR SCANNING KEYBOARD CIRCUIT

CROSS-REFERENCE TO RELATED APPLICATION

This application claims priority to Chinese application No. 201910940438.0, filed Sep. 30, 2019, which is herein incorporated by reference in its entirety.

BACKGROUND

Field of Invention

The present invention relates to a keyboard scanning technology. More particularly, the present invention relates to a method for scanning a keyboard circuit.

Description of Related Art

In many electronic devices, such as a notebook or portable electronic devices, it is necessary to set a circuit associated with the scanning array for identifying the position of a pressed key. Commonly, such circuit includes a plurality of keys forming an array and a scanning circuit. The scanning circuit provides a signal to the key array, and receives a signal from the key array for the purpose of the recognition.

However, wires exist between the scan circuit and the key array. The accuracy of identification of the pressed key is affected easily by the parasitic effects that exist in these wires. In addition, the difficulty of the scanning is can be increased due to the differences in the design of such key array.

Therefore, designing a new method for scanning the keyboard circuit for solving the above-mentioned shortcomings is a problem in the industry.

SUMMARY

This summary is intended to provide a simplified summary of this disclosure so that the reader may have a basic understanding of this disclosure. This summary is not a comprehensive overview of this disclosure, and it is not intended to indicate important/critical elements of the embodiments of this disclosure or to define the scope of this disclosure.

One purpose of this summary is used to provide a method for scanning a keyboard circuit, thereby improving the problems of the prior art.

To achieve the above purpose, an aspect of this disclosure is related to a method for scanning a keyboard circuit. The keyboard circuit includes a keyboard array, a plurality of output wires, a plurality of input wires, and a scanning circuit. The keyboard array includes a plurality of key units. Each of the output wires is electrically coupled to a corresponding column of key units of a plurality of columns of key units of the keyboard array, respectively. Each of the input wires is electrically coupled to a corresponding row of key units of a plurality of rows of key units of the keyboard array, and is provided with a pull-up resistor, respectively. The scanning circuit is electrically coupled to each of the output wires through a corresponding open-drain transistor of a plurality of open-drain transistors, respectively, and the scanning circuit is electrically coupled to the input wires. The scanning circuit turns on the open-drain transistors and connects the open-drain transistors to the ground in a charge-cleaning segment of a scanning interval to clean charges on the output wires. The scanning circuit only turns on the open-drain transistors and connects the open-drain transistors to the ground during a respective independent scanning period in a scanning duration in the order of the plurality of columns of key units. The scanning circuit receives a plurality of detected electrical levels through the input wires in the scanning duration, and when one of the detected electrical levels is substantially equal to the electrical level of the ground, determines the corresponding key unit of the key units that is pressed which electrically couples the corresponding output wire of the output wires and the corresponding input wire of the input wires.

The method for scanning a keyboard circuit of the present disclosure may remove the charges during the scanning interval, prevent the accumulation of the charges caused by the parasitic capacitance from affecting the scanning result of the keyboard, and perform adaptively the scanning in different ways for different types of keyboards.

It is to be understood that both the foregoing general description and the following detailed description are by examples, and are intended to provide further explanation of the invention as claimed.

BRIEF DESCRIPTION OF THE DRAWINGS

In order to make the above and other purposes, features, advantages, and embodiments of this disclosure more comprehensible, the description of the drawings is as follows.

DETAILED DESCRIPTION

Reference will now be made in detail to the present embodiments of the invention, examples of which are illustrated in the accompanying drawings.

Wherever possible, the same reference numbers are used in the drawings and the description to refer to the same or like parts.

Figure 1:
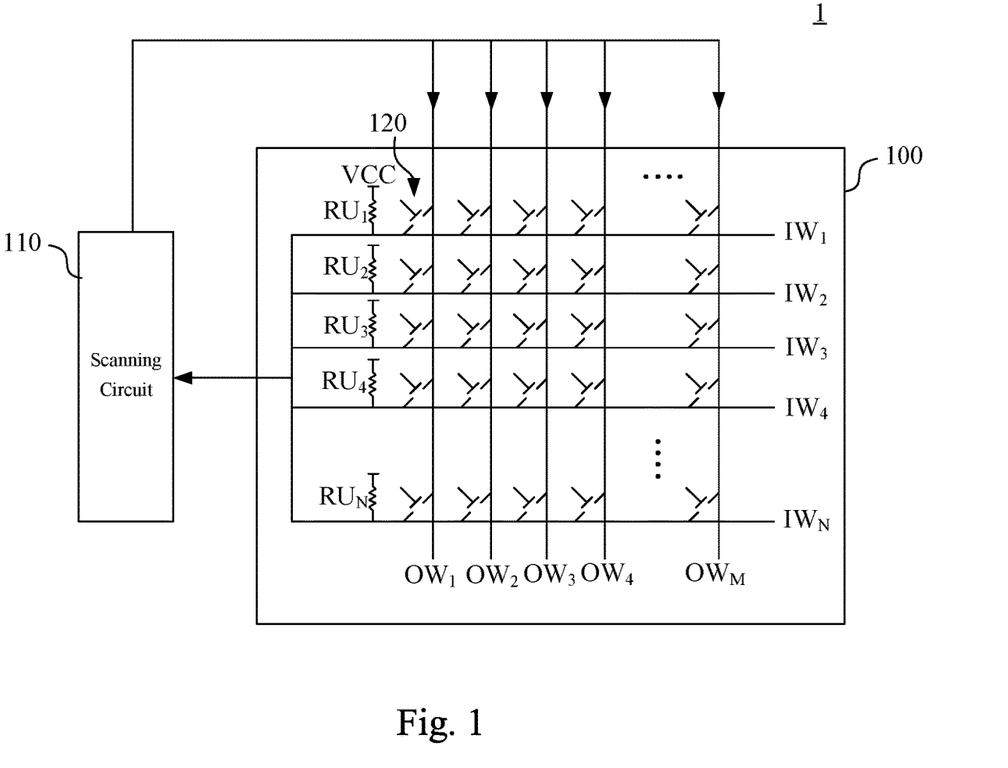
FIG. 1 is a block diagram of a keyboard circuit in one embodiment of this disclosure.

Reference is made to FIG. 1. FIG. 1 is a block diagram of a keyboard circuit 1 in one embodiment of this disclosure. The keyboard circuit 1 includes a keyboard array 100, a plurality of output wires $OW_1$-$OW_M$, a plurality of input wires $IW_1$-$IW_N$, and a scanning circuit 110.

The keyboard array 100 includes a plurality of key units 120 arranged in an array. In one embodiment, the key units 120 are arranged in M columns and N rows, where the total amount of the key units 120 is M×N.

Each of the output wires $OW_1$-$OW_M$ is electrically coupled to a corresponding column of key units 120, respectively. Each of the input wires $IW_1$-$IW_N$ is electrically coupled to a corresponding column of key units 120 of the keyboard array 100, respectively. In one embodiment, the input wires $IW_1$-$IW_N$ are provided with pull-up resistors $RU_1$-$RU_N$, respectively. One end of each of the pull-up resistors $RU_1$-$RU_N$ is electrically coupled to a power source VCC, and the other end of each of the pull-up resistors $RU_1$-$RU_N$ is electrically coupled to each of the input wires $IW_1$-$IW_N$, respectively, to pull up the electrical level of the input wires $IW_1$-$IW_N$.

The scanning circuit 110 is configured to be electrically coupled to the output wires $OW_1$-$OW_M$ and the input wires $IW_1$-$IW_N$, to control the electrical level of the output wires $OW_1$-$OW_M$ sequentially to perform scanning, and to determine whether the key units 120 is pressed or not via detecting the electrical level of the input wires $IW_1$-$IW_N$.

Figure 2:
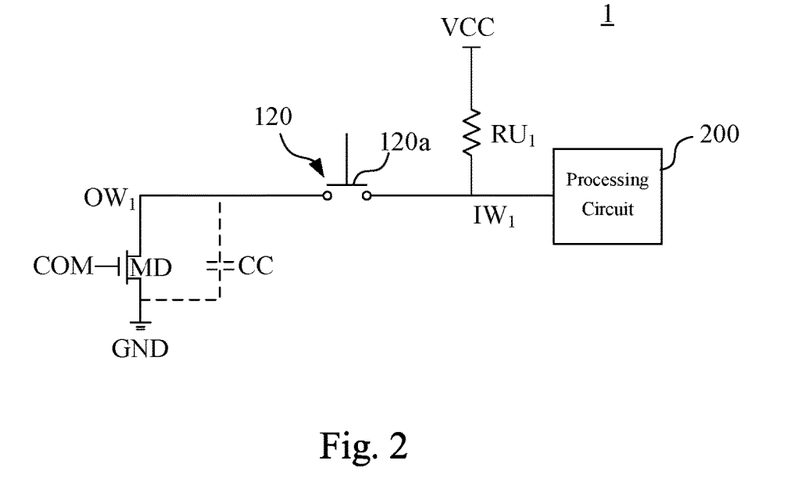
FIG. 2 is a simplified circuit diagram of the keyboard circuit of FIG. 1 in one embodiment of this disclosure.

Reference is made to FIG. 2. FIG. 2 is a simplified circuit diagram of the keyboard circuit 1 of FIG. 1 in one embodiment of this disclosure.

FIG. 2 illustrates a key unit 120a on the first row and the first column of the key units 120. When the key unit 120a is pressed, one end of the key unit 120a is electrically coupled to the open-drain transistor MD included in the scanning circuit 110 through the output wire $OW_1$, and the other end of the key unit 120a is electrically coupled to the scanning circuit 110 through the input wire $IW_1$, for example but not limited to the processing circuit 200 included in the scanning circuit 110. It should be noted that the scanning circuit 110 may comprise M open-drain transistors MD, so that each of the M open-drain transistors MD is electrically coupled to the corresponding output wire of the output wires $OW_1$-$OW_M$, respectively.

In one embodiment, turning on and turning off the open-drain transistors MD may be controlled by a control signal COM generated by the processing circuit 200.

The accumulation of charges on the output wire OW1 may occur due to the parasitic capacitance CC effects. FIG. 2 shows the parasitic capacitance CC by dashed lines. When the length of the output wire $OW_1$ is longer, the effect of the parasitic capacitance CC will be stronger and the capacitance value will be larger.

The operation mechanism of the keyboard circuit 1 will be described in detail below.

Figure 3:
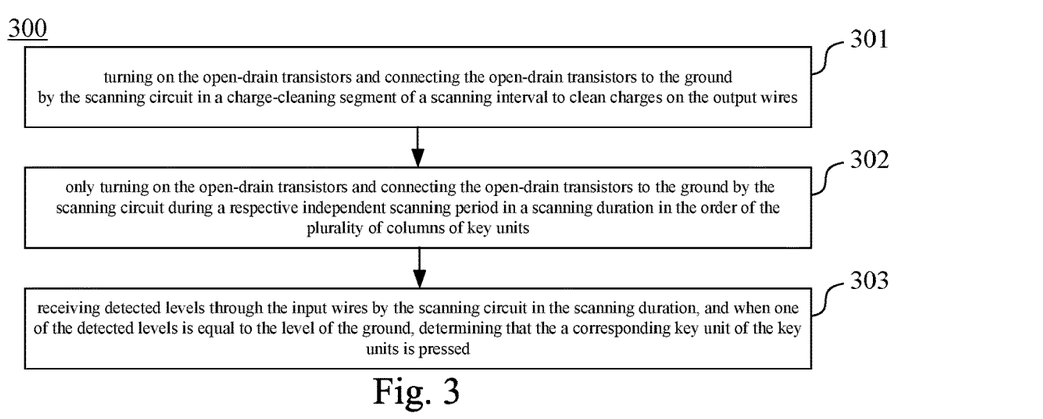
FIG. 3 is a flowchart of a method for scanning a keyboard circuit in one embodiment of this disclosure.
Figure 4:
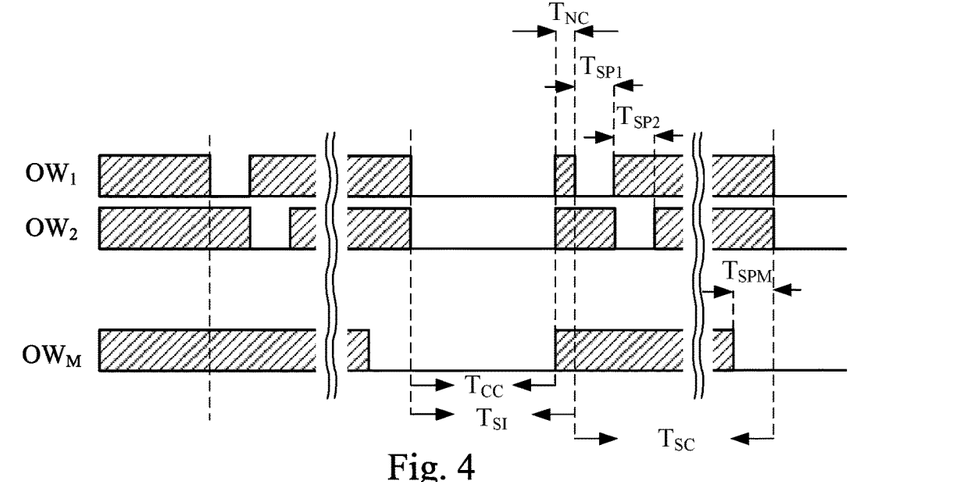
FIG. 4 is a voltage waveform graph of each column of the output wires in one embodiment of this disclosure.

Reference is made to FIGS. 3 and 4 simultaneously. FIG. 3 is a flowchart of a method 300 for scanning a keyboard circuit in one embodiment of this disclosure. FIG. 4 is a voltage waveform graph of each column of the output wires $OW_1$-$OW_M$ in one embodiment of this disclosure.

The method 300 may be applied to the keyboard circuit 1 shown in FIG. 1. The method 300 includes the following steps (it should be noted that the order of the steps recited in this detailed description may be adjusted according to actual needs, and may be performed simultaneously or partially, except for those that specifically describe the order).

At step 301, the open-drain transistors MD are turned on and connected to the ground GND by the scanning circuit 110 in a charge-cleaning segment $T_{CC}$ of a scanning interval $T_{SI}$ to clean charges on the output wires $OW_1$-$OW_M$. In one embodiment, the scanning interval $T_{SI}$ is used for performing the debounce.

In the example of the key unit 120a shown in FIG. 2, the scanning circuit 110 may turn on the open-drain transistor MD and electrically couple the open-drain transistor MD to the ground GND by the control signal COM to clear the charge on the output wire $OW_1$. Therefore, when the scanning circuit 110 turns on the corresponding open-drain transistors MD of all output wires $OW_1$-$OW_M$ and connects the corresponding open-drain transistors MD of all output wires $OW_1$-$OW_M$ to the ground GND, the charges on all output wires $OW_1$-$OW_M$ may be cleared.

In one embodiment, the scanning interval $T_{SI}$ further includes a non-charge-clearing segment $T_{NC}$. In the embodiment of FIG. 4, the charge-cleaning segment $T_{CC}$ is prior to the non-charge-clearing segment $T_{NC}$.

At step 302, the open-drain transistors MD are only turned on and connected to the ground GND by the scanning circuit 110 during a respective independent scanning period $T_{SP1}$-$T_{SPM}$ in a scanning duration $T_{SC}$ in the order of the plurality of columns of key units (for example, the first column, the second column . . . through $M_{th}$ column).

As shown in FIG. 4, during the scanning period $T_{SP1}$, the open-drain transistor MD corresponding to the first column of key units 120 is turned on and connected to the ground GND, to connect the output wire $OW_1$ to the ground GND. At this time, the open-drain transistors MD corresponding to the second column to the $M_{th}$ column of key units 120 are turned off. In this state, the electrical levels of the output wires $OW_2$-$OW_M$ corresponding to the second column to the $M_{th}$ column of key units 120 are in the floating state.

Next, during the scanning period $T_{SP2}$, the open-drain transistor MD corresponding to the second column of key units 120 is turned on and connected to the ground GND, to connect the output wire $OW_2$ to the ground GND. At this time, the open-drain transistors MD corresponding to the first column and the third column to the $M_{th}$ column of key units 120 are turned off. In this state, the electrical levels of the output wires $OW_1$ and $OW_3$-$OW_M$ corresponding to the first column and the third column to the $M_{th}$ column of key units 120 are in the floating state.

By performing the above through the scanning period $T_{SPM}$, each column of the key units 120 may be scanned.

At step 303, the detected electrical levels are received through the input wires $IW_1$-$IW_N$ by the scanning circuit 110 in the scanning duration $T_{SC}$, and when one of the detected electrical levels is substantially equal to the electrical level of the ground GND, the scanning circuit 110 determines that the corresponding key unit of the key units 120 is pressed.

For example, when the key unit 120a shown in FIG. 2 is pressed during the scanning period $T_{SP1}$, the output wire $OW_1$ and the input wire $IW_1$ are electrically coupled to each other. The electrical level of input wire $IW_1$ is pulled to the electrical level of the ground GND, since the open-drain transistor MD is turned on and connected to the ground GND.

In contrast, when the key unit 120 is not pressed, the output wire $OW_1$ and the input wire $IW_2$ are not electrically coupled to each other. The electrical level of the input wire $IW_2$ is pulled up and is not substantially equal to the electrical level of the ground GND due to the pull-up resistor $RU_2$.

Thus, the key units 120 of other rows in this column and the key units 120 of other columns are determined by the above way, to achieve the effect of the keyboard scanning.

In one embodiment, the scanning circuit 110 may perform, for example, the above scanning process for two times, and perform the comparison, so that when the key unit is detected to be pressed for two times, the scanning circuit 110 may determine that the key unit is pressed.

Figure 5:
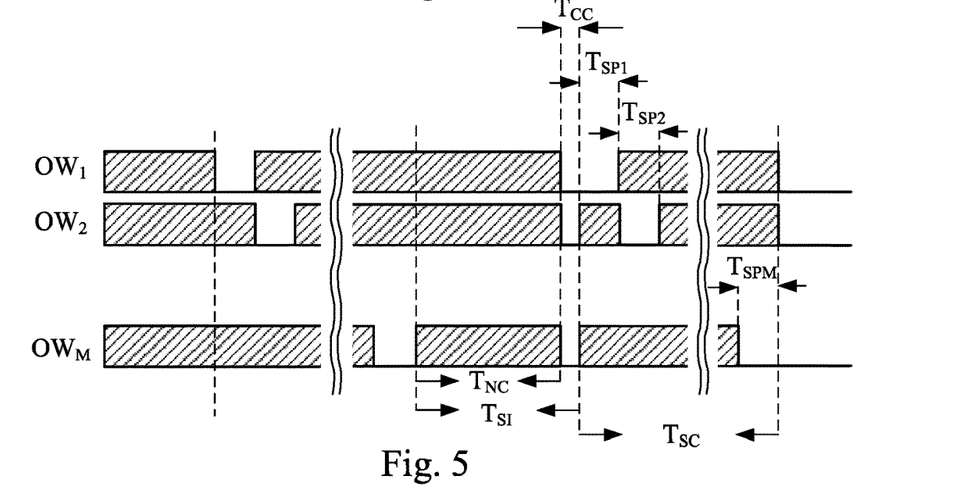
FIG. 5 is a voltage waveform graph of each column of the output wires in another embodiment of this disclosure.

Reference is made to FIG. 5. FIG. 5 is a voltage waveform graph of each column of the output wires $OW_1$-$OW_M$ in another embodiment of this disclosure.

Based on the above, the scanning interval $T_{SI}$ may include the charge-clearing segment $T_{CC}$ and the non-charge-clearing segment $T_{NC}$. In the embodiment of FIG. 5, the charge-cleaning segment $T_{CC}$ is following the non-charge-clearing segment $T_{NC}$, and prior to the scanning duration $T_{SC}$. Therefore, in such embodiments, the time length of the charge-cleaning segment $T_{CC}$ does not need to be too long.

In some techniques, the scanning circuit 110 turns off the open-drain transistors MD during the scanning interval $T_{SI}$. This design may accumulate the charges on the output wires $OW_1$-$OW_M$ easily due to the presence of the parasitic capacitance. The accumulated charges may cause that the open-drain transistors MD that is turned on and connected to the ground GND has no time to release the charges in the scanning duration $T_{SC}$, so that the input wire that should be in the electrical level of the ground GND after pressing the key unit 120 is in the electrical level of non-ground due to the accumulation of the charges, to affect the determining result.

Accordingly, the method 300 for scanning the keyboard circuit in this disclosure may turn on the open-drain transistors MD and connect the open-drain transistors MD to the ground GND in the charge-cleaning segment $T_{CC}$ of the scanning interval $T_{SI}$ to clean the charges on the output wires $OW_1$-$OW_M$ to prevent the accumulated charges from affecting the results of the keyboard scanning.

Figure 6A:
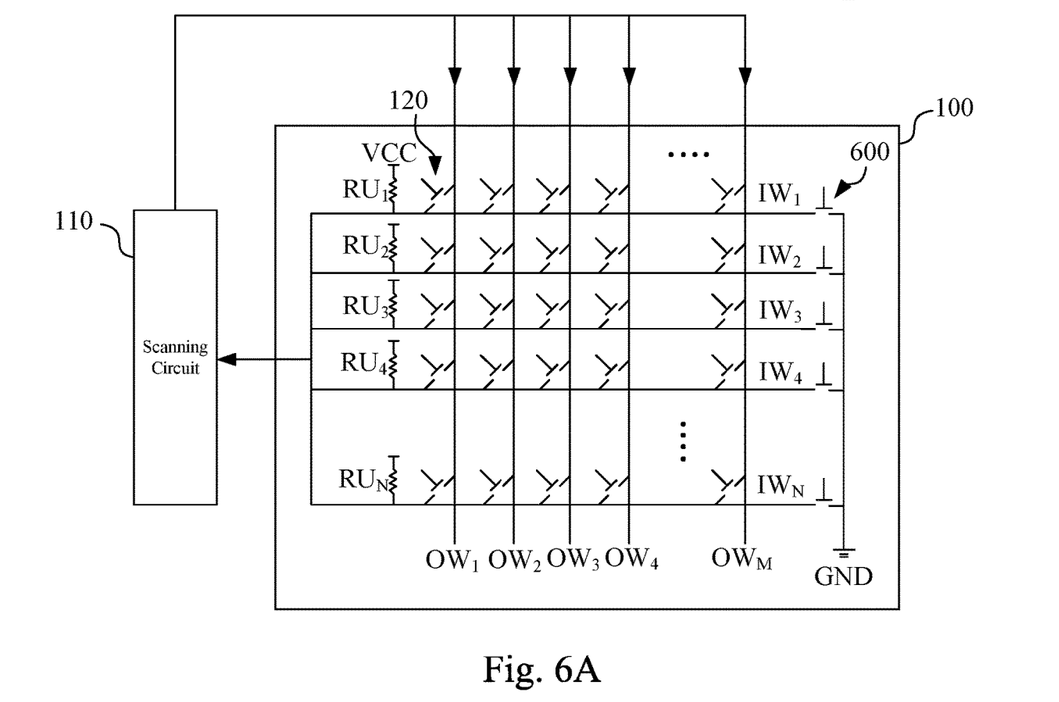
FIG. 6A is a block diagram of a keyboard circuit in one embodiment of this disclosure.
Figure 6B:
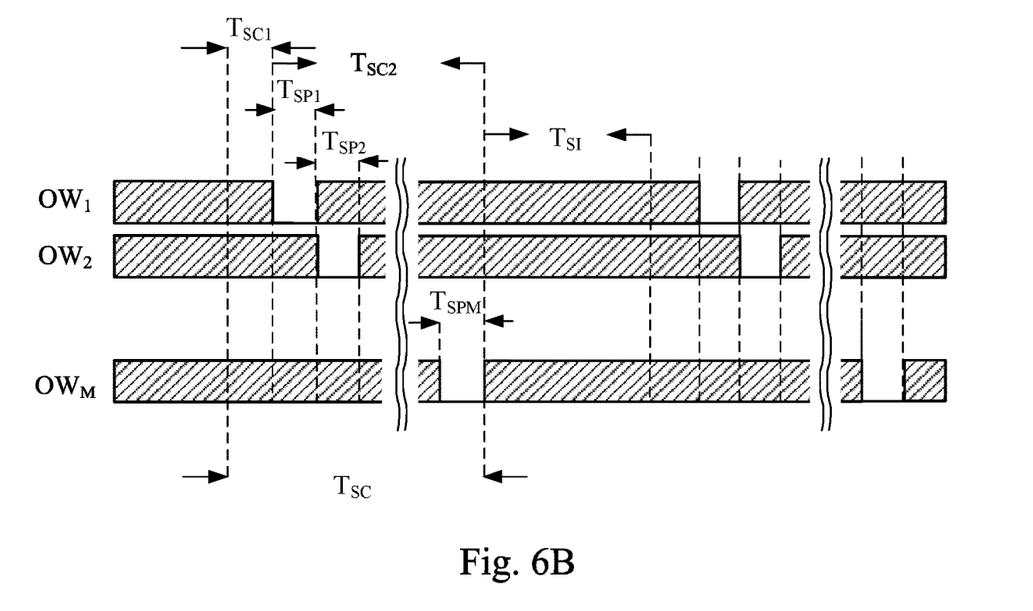
FIG. 6B is a voltage waveform graph of each column of the output wires in one embodiment of this disclosure.

Reference is made to FIGS. 6A and 6B simultaneously. FIG. 6A is a block diagram of a keyboard circuit 6 in one embodiment of this disclosure.

FIG. 6B is a voltage waveform graph of each column of the output wires $OW_1$-$OW_M$ in one embodiment of this disclosure.

The keyboard circuit 6 is similar with the keyboard circuit 1 depicted in FIG. 1, and includes a keyboard array 100, a plurality of output wires $OW_1$-$OW_M$, a plurality of input wires $IW_1$-$IW_N$, and a scanning circuit 110. However, comparing with the keyboard circuit 1, the keyboard circuit 6 further includes ground key units 600 arranged in one column. Each of the ground key units 600 is electrically coupled between the corresponding input wire of the input wires $IW_1$-$IW_N$ and the ground GND, respectively, when pressed.

In this case, as shown in FIG. 6B, the scanning duration $T_{SC}$ includes a first scanning segment $T_{SC1}$ and a second scanning segment $T_{SC2}$ for scanning the ground key units 600 and the key units 120, respectively.

In more detail, in the first scanning segment $T_{SC1}$, the scanning circuit 110 turns off the open-drain transistors MD corresponding to all output wires $OW_1$-$OW_M$.

Next, the scanning circuit 110 receives the first detected electrical levels through the input wires $IW_1$-$IW_N$ in the first scanning segment $T_{SC1}$. In this case, the output wires $OW_1$-$OW_M$ should be in the floating state due to the turning off of the open-drain transistors MD, theoretically. In contrast, the electrical levels of the input wires $IW_1$-$IW_N$ are pulled up due to the pull-up resistors $RU_1$-$RU_N$.

At this time, if none of the ground key units 600 is pressed, there is no effect on the first detected electrical levels of the input wires $IW_1$-$IW_N$. However, each of the ground key units 600 is electrically coupled to the ground GND when pressed, so that the electrical levels of the input wires $IW_1$-$IW_N$ are pulled to the electrical level of the ground GND.

Therefore, if one of the first detected electrical levels is substantially equal to the electrical level of the ground GND, it may be determined that the corresponding ground key unit of the ground key units 600 is pressed and electrically coupled to the ground GND.

Further, in the second scanning segment $T_{SC2}$, the scanning circuit 110 may perform the progressive scanning as shown in FIG. 4 and receive the second detected electrical levels through the input wires $IW_1$-$IW_N$. Since the ground key unit of the ground key units 600 and the key unit of the key units 120 in the same row may be pressed simultaneously, the scanning circuit 110 may determine that the corresponding key unit of the key units 120 is pressed when one of the second detected electrical levels is substantially equal to the electrical level of the ground GND and the corresponding ground key unit of the ground key units 600 is not pressed.

It should be noted that although not specifically shown, the charge-cleaning segment $T_{CC}$ and the non-charge-cleaning segment $T_{NC}$ shown in FIG. 4 may be applied to the scanning interval $T_{SI}$ of FIG. 6B.

Figure 7A:
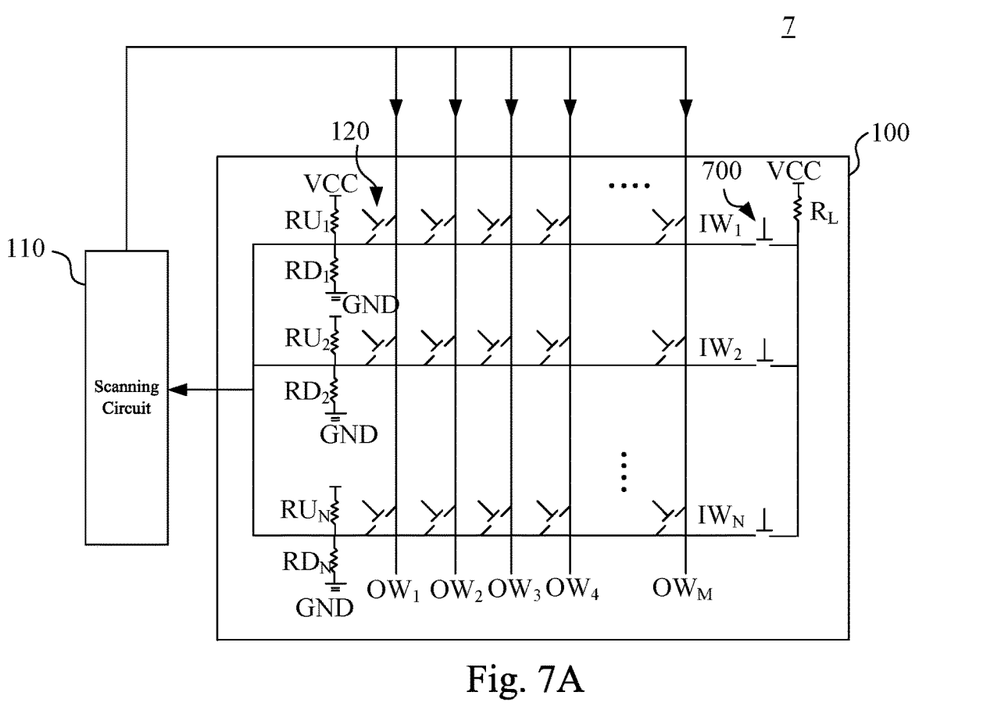
FIG. 7A is a block diagram of a keyboard circuit in one embodiment of this disclosure.
Figure 7B:
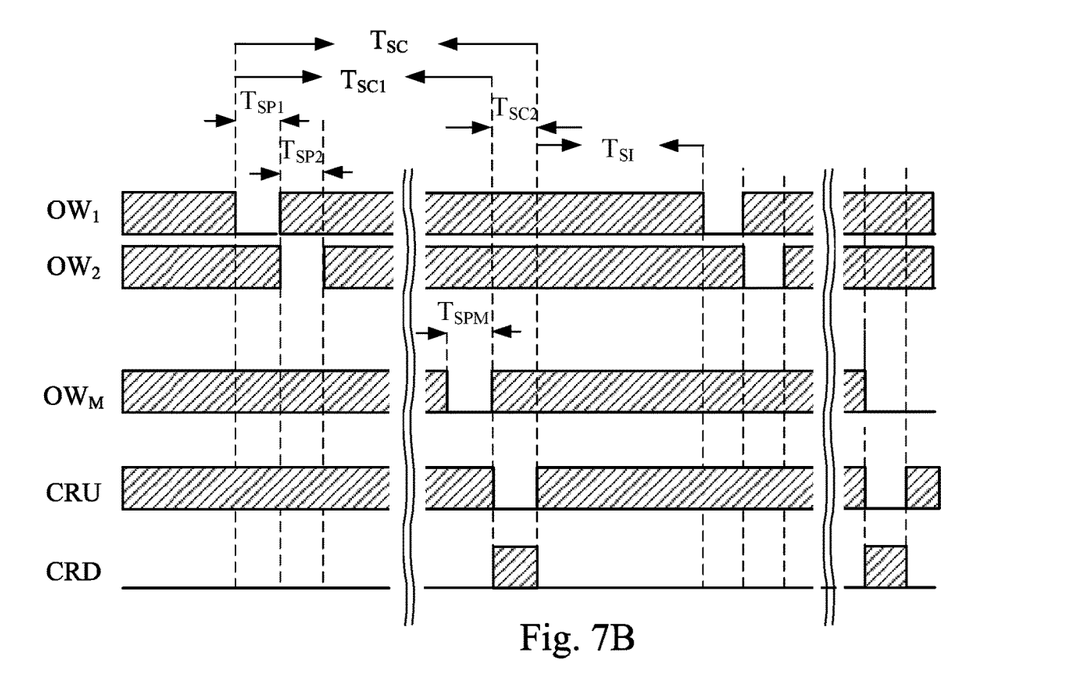
FIG. 7B is a voltage waveform graph of each column of the output wires in one embodiment of this disclosure.

Reference is made to FIGS. 7A and 7B simultaneously. FIG. 7A is a block diagram of a keyboard circuit 7 in one embodiment of this disclosure. FIG. 7B is a voltage waveform graph of each column of the output wires $OW_1$-$OW_M$ in one embodiment of this disclosure.

The keyboard circuit 7 is similar with the keyboard circuit 1 depicted in FIG. 1, and includes a keyboard array 100, a plurality of output wires $OW_1$-$OW_M$, a plurality of input wires $IW_1$-$IW_N$, and a scanning circuit 110. However, comparing with the keyboard circuit 1, the keyboard circuit 7 further includes power key units 700 arranged in one column. Each of the power key units 700 is electrically coupled between the corresponding input wire of the input wires $IW_1$-$IW_N$ and the power source VCC, respectively, when pressed. In one embodiment, each of the power key units 700 is electrically coupled to the power source VCC through a current-limiting resistor $R_L$, when pressed.

Further, the input wires $IW_1$-$IW_N$ in this embodiment are further provided with pull-down resistors $RD_1$-$RD_N$, respectively. In addition, the pull-up resistors $RU_1$-$RU_N$ and the pull-down resistors $RD_1$-$RD_N$ may be enabled or disabled, respectively.

In one embodiment, the pull-up resistors $RU_1$-$RU_N$ are enabled and disabled through the high state and the low state of the control signal CRU, the pull-down resistor $RD_1$-$RD_N$ are enabled and disabled through the high state and the low state of the control signal CRD. The control signal CRU and the control signal CRD both are shown in FIG. 7B.

In this case, as shown in FIG. 7B, the scanning duration $T_{SC}$ includes the first scanning segment $T_{SC1}$ and the second scanning segment $T_{SC2}$ for scanning the key units 120 and the power key units 700, respectively.

In the first scanning segment $T_{SC1}$, the pull-up resistors $RU_1$-$RU_N$ are enabled, and the pull-down resistors $RD_1$-$RD_N$ are disabled. The scanning circuit 110 may perform the progressive scanning as shown in FIG. 4 and receive the first detected electrical levels through the input wires $IW_1$-$IW_N$. Further, when one of the first detected electrical levels is substantially equal to the electrical level of the ground GND, the scanning circuit 110 may determine that the corresponding key unit 120 is pressed.

In the second scanning segment $T_{SC2}$, the pull-up resistors $RU_1$-$RU_N$ are disabled, and the pull-down resistors $RD_1$-$RD_N$ are enabled. The scanning circuit 110 further turns off all of the open-drain transistors MD and receives a plurality of second detected electrical levels through the input wires $IW_1$-$IW_N$. In this case, the output wires $OW_1$-$OW_M$ should be in the floating state due to the turning off of the open-drain transistors MD, theoretically. In contrast, the electrical levels of the input wires $IW_1$-$IW_N$ are pulled down due to the pull-down resistors $RD_1$-$RD_N$.

At this time, if none of the power key units 700 is pressed, there is no effect on the second detected electrical levels of the input wires $IW_1$-$IW_N$. However, each of the power key units 700 is electrically coupled to the power source VCC when pressed, so that the electrical levels of the input wires $IW_1$-$IW_N$ are pulled to a electrical level which is not the electrical level of the ground GND. In one embodiment, the specific electrical level is determined by the voltage division between the current-limiting resistor RL and the corresponding pull-down resistors $RD_1$-$RD_N$.

Thus, the scanning circuit 110 receives the second detected electrical levels through the input wires $IW_1$-$IW_N$, and when one of the second detected electrical levels is greater than a preset electrical level, the scanning circuit 110 determines that the corresponding power key unit of the power key units 700 is pressed.

In one embodiment, each of the resistance values of the pull-down resistors $RD_1$-$RD_N$ is greater than the resistance value of the current-limiting resistor $R_L$, and the resistance ratio of each of the resistance values of the pull-down resistors $RD_1$-$RD_N$ to the resistance value of the current-limiting resistor $R_L$ is greater than a preset value. The aforementioned preset electrical level is determined by this resistance ratio. In one embodiment, the resistance ratio of each of the pull-down resistors $RD_1$-$RD_N$ to the current-limiting resistor $R_L$ may be set so that the preset electrical level is close to the electrical level of the power source VCC. For example, each of the resistance values of the pull-down resistors $RD_1$-$RD_N$ may be set to 50K ohms, and the resistance value of the current-limiting resistor $R_L$ may be set to 4.7K ohms. However, this disclosure is not limited thereto.

It should be noted that although not specifically shown, the charge-cleaning segment $T_{CC}$ and the non-charge-cleaning segment $T_{NC}$ shown in FIG. 4 may be applied to the scanning interval $T_{SI}$ of FIG. 7B.

Figure 8A:
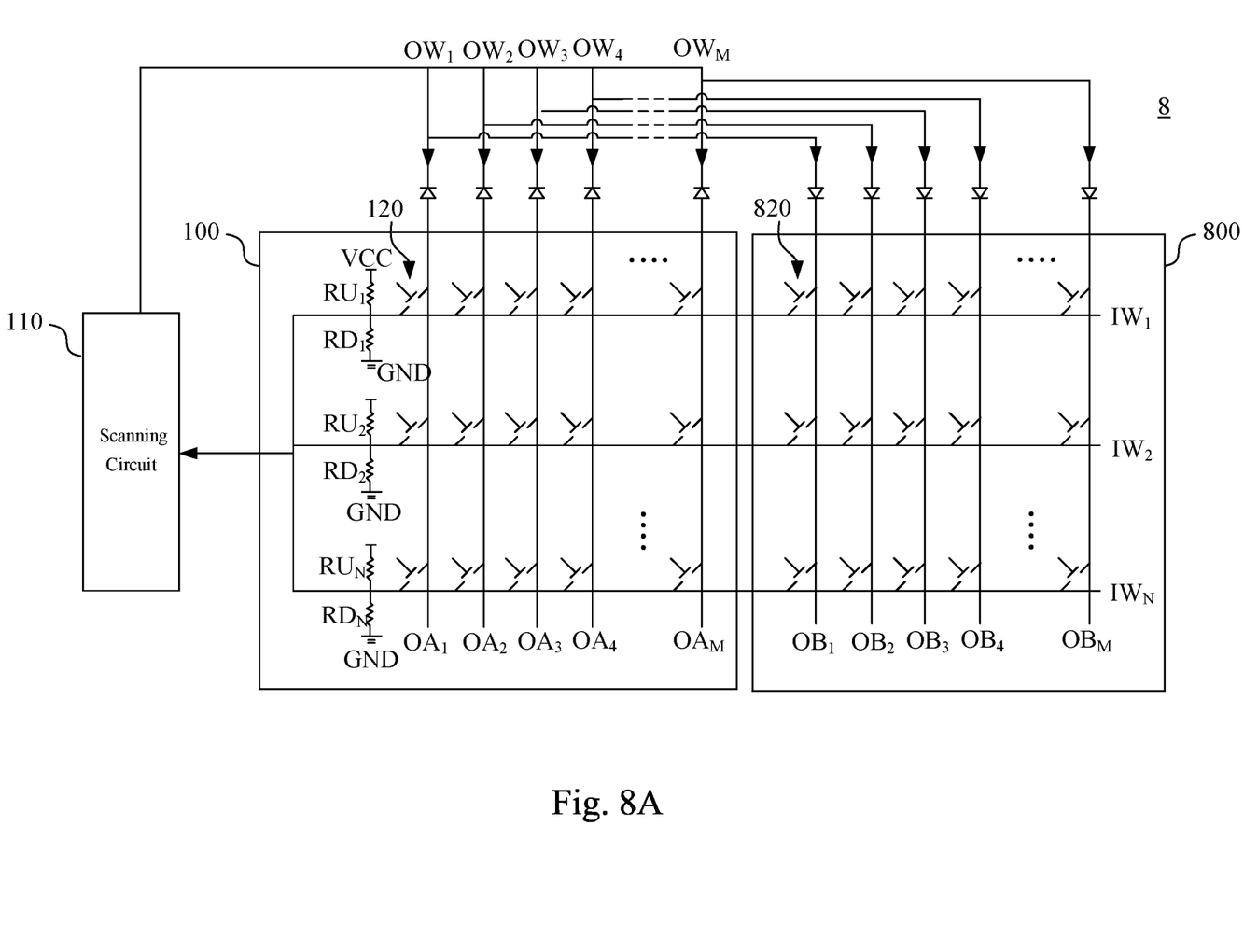
FIG. 8A is a block diagram of a keyboard circuit in one embodiment of this disclosure.
Figure 8B:
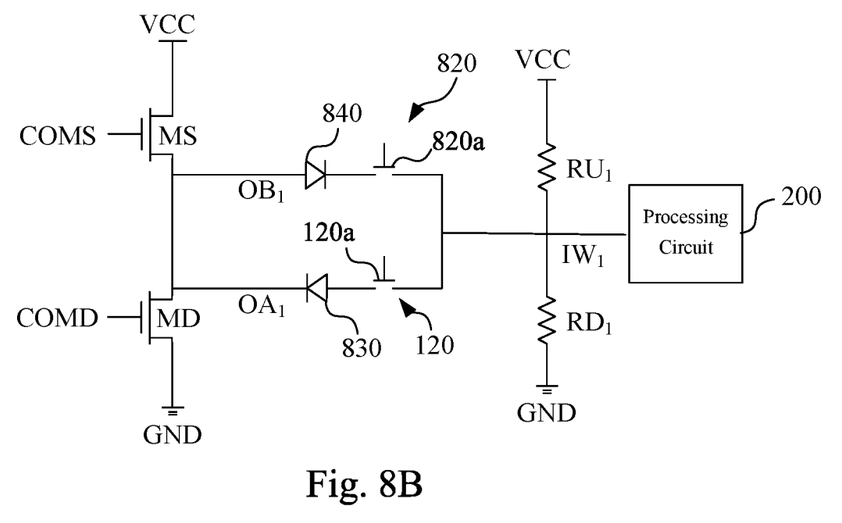
FIG. 8B is a simplified circuit diagram of the keyboard circuit of FIG. 8A in one embodiment of this disclosure.
Figure 8C:
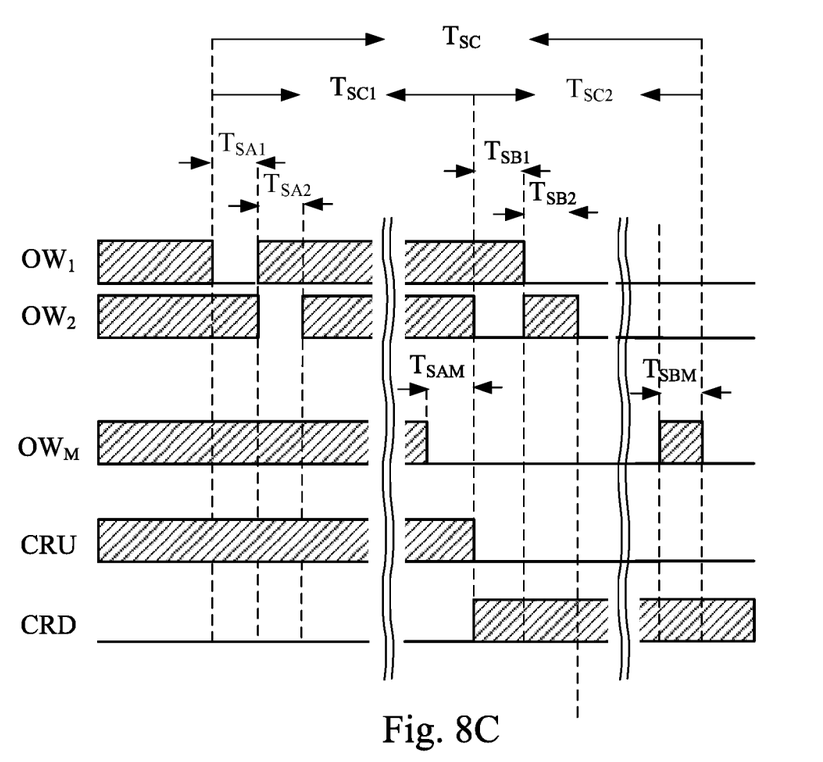
FIG. 8C is a voltage waveform graph of each column of the output wires in one embodiment of this disclosure.

Reference is made to FIGS. 8A, 8B, and 8C simultaneously. FIG. 8A is a block diagram of a keyboard circuit 8 in one embodiment of this disclosure. FIG. 8B is a simplified circuit diagram of the keyboard circuit 8 of FIG. 8A in one embodiment of this disclosure. FIG. 8C is a voltage waveform graph of each column of the output wires $OW_1$-$OW_M$ in one embodiment of this disclosure.

The keyboard circuit 8 is similar with the keyboard circuit 1 depicted in FIG. 1, and includes a keyboard array 100, a plurality of output wires $OW_1$-$OW_M$, a plurality of input wires $IW_1$-$IW_N$, and a scanning circuit 110. However, comparing with the keyboard circuit 1, the keyboard circuit 8 further includes an external keyboard array 800.

The external keyboard array 800 includes external key units 820 having the same number of rows and columns with the keyboard array 100. In this embodiment, the output wires $OW_1$-$OW_M$ include first branches $OA_1$-$OA_M$ and second branches $OB_1$-$OB_M$. Each of the output wires $OW_1$-$OW_M$ is electrically coupled to the corresponding column of the key units 120 by the corresponding first branch of the first branches $OA_1$-$OA_M$ and electrically coupled to the corresponding column of the external key units 820 by the corresponding second branch of the second branches $OB_1$-$OB_M$.

In addition to being electrically coupled to the corresponding row of key units of the rows of key units 120, each of the input wires $IW_1$-$IW_N$ is also electrically coupled to the corresponding column of external key units of the columns of the external key units 820. In addition to the pull-up resistors $RU_1$-$RU_N$, the input wires $IW_1$-$IW_N$ are further provided with pull-down resistors $RD_1$-$RD_N$, respectively.

FIG. 8B illustrates the key unit 120a on the first row and the first column of the keyboard array 100, and an external key unit 820a on the first row and the first column of the external keyboard array 800. When the key unit 120a is pressed, one end of the key unit 120a is electrically coupled to the open-drain transistor MD included in the scanning circuit 110 through a first branch $OA_1$ of the output wire $OW_1$ and the other end of the key unit 120a is electrically coupled to the processing circuit 200 of the scanning circuit 110 through the input wire $IW_1$. When the external key unit 820a is pressed, one end of the external key unit 820a is electrically coupled to the open-source transistor MS included in the scanning circuit 110 through a second branch $OB_1$ of the output wire $OW_1$, and the other end of the external key unit 820a is electrically coupled to the processing circuit 200 of the scanning circuit 110 through the input wire $IW_1$. The source of the open-source transistor MS is electrically coupled to the drain of the open-drain transistor MD. The open-source transistor MS and the open-drain transistor MD are controlled by the control signals COMS and COMD, respectively.

It should be noted that the scanning circuit 110 may comprise M open-drain transistors MD and M open-source transistors MS, so that each of the M open-drain transistors MD and each of the M open-source transistors MS are electrically coupled to the first branch and the second branch of the corresponding output wire of the output wires $OW_1$-$OW_M$, respectively.

Further, the input wires $IW_1$-$IW_N$ in this embodiment are further provided with pull-down resistors $RD_1$-$RD_N$, respectively. In addition, the pull-up resistors $RU_1$-$RU_N$ and the pull-down resistors $RD_1$-$RD_N$ may be enabled or disabled, respectively.

In one embodiment, the pull-up resistors $RU_1$-$RU_N$ are enabled and disabled through the high state and the low state of the control signal CRU, the pull-down resistor $RD_1$-$RD_N$ are enabled and disabled through the high state and the low state of the control signal CRD. The control signal CRU and the control signal CRD both are shown in FIG. 8C.

In this case, as shown in FIG. 8C, the scanning duration $T_{SC}$ includes the first scanning segment $T_{SC1}$ and the second scanning segment $T_{SC2}$ for scanning the key units 120 and the external key units 820, respectively.

In the first scanning segment $T_{SC1}$, the pull-up resistors $RU_1$-$RU_N$ are enabled, and the pull-down resistors $RD_1$-$RD_N$ are disabled. The scanning circuit 110 may perform the progressive scanning as shown in FIG. 4, and therefore the description will not be repeated.

In the second scanning segment $T_{SC2}$, the pull-up resistors $RU_1$-$RU_N$ are disabled, and the pull-down resistors $RD_1$-$RD_N$ are enabled. The scanning circuit 110 further performs the progressive scanning in the order of the columns of external key units 820. As shown in FIG. 8B, the scanning circuit 110 turns on the open-drain transistor MS and connects the open-drain transistor MS to power source VCC, to pull up the electrical level of the second branch $OB_1$. When one of the second detected electrical levels received through the input wire $IW_1$ is greater than the preset electrical level, the scanning circuit 110 determines the corresponding external key unit of the external key units 820 that is pressed which electrically couples the second branch $OB_1$ to the input wire $IW_1$ and further to the power source VCC, to pull up the electrical level of input wire $IW_1$.

When the scanning circuit 110 performs the scanning for the keyboard array 100, the open-drain transistors MD corresponding to the rows of the key units 120 are only turned on during the respective independent first scanning periods $T_{SA1}$-$T_{SAM}$. When the scanning circuit 110 performs the scanning for the external keyboard array 800, the open-drain transistors MD corresponding to the rows of the key units 120 are only turned on during the respective independent second scanning periods $T_{SB1}$-$T_{SBM}$.

In one embodiment, the first branch $OA_1$ includes a first diode 830. The anode of the first diode 830 is electrically coupled to the corresponding key unit 120a of the key units 120, and the cathode of the first diode 830 is electrically coupled to the corresponding open-drain transistor MD. The second branch $OB_1$ includes a second diode 840. The anode of the second diode 840 is electrically coupled to the corresponding open-source transistor MS of the open-source transistors MS, and the cathode of the second diode 840 is electrically coupled to the corresponding external key unit 820a of the external key units 820. When the open-drain transistors MD and the open-source transistors MS are operated to pull up or down the first branches $OA_1$-$OA_M$ and the second branches $OB_1$-$OB_M$ which may not affect each other.

It should be noted that although not specifically shown, the charge-cleaning segment $T_{CC}$ and the non-charge-cleaning segment $T_{NC}$ shown in FIG. 4 may be applied to the scanning interval $T_{SI}$ of FIG. 8C.

Figure 9:
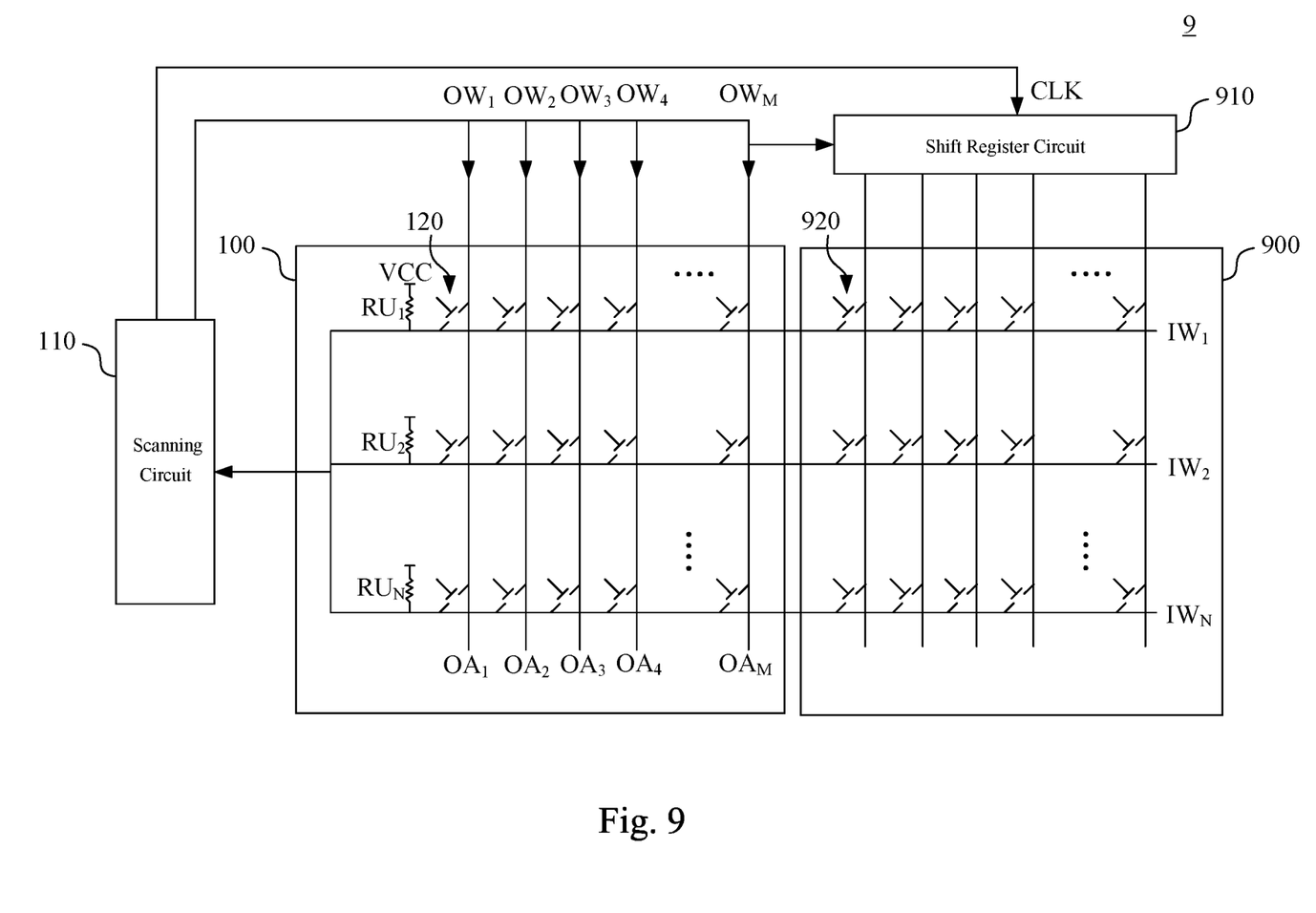
FIG. 9 is a block diagram of a keyboard circuit in one embodiment of this disclosure.

Reference is made to FIG. 9. FIG. 9 is a block diagram of a keyboard circuit 9 in one embodiment of this disclosure.

The keyboard circuit 9 is similar with the keyboard circuit 1 depicted in FIG. 1, and includes a keyboard array 100, a plurality of output wires $OW_1$-$OW_M$, a plurality of input wires $IW_1$-$IW_N$, and a scanning circuit 110. However, comparing with the keyboard circuit 1, the keyboard circuit 9 further includes an external keyboard array 900 and a shift register circuit 910.

The external keyboard array 900 includes external key units 920 having the same number of rows with the keyboard array 100. The shift register circuit 910 includes a plurality of shift registers (not shown) with the open-drain function electrically coupled to the plurality of columns of external key units 920 correspondingly.

In this case, two scanning segments of the scanning duration of the scanning circuit 110 perform the scanning for the key units 120 and the external key units 920, respectively. In the first scanning segment, the scanning circuit 110 may perform the progressive scanning as shown in FIG. 4, and therefore the description will not be repeated. In the second scanning segment, the shift register circuit 910 may receive an output electrical level (the electrical level of the ground) of the output wire $OW_M$ corresponding to the last row of key units 230, and shift the output electrical level in the order of the columns of external key units 920. When one of the second detected electrical levels received through the input wires $IW_1$-$IW_N$ is substantially equal to the electrical level of the ground, the scanning circuit 110 determines the corresponding external key unit of the external key units 920 that is pressed which electrically couples the shift register circuit 910 and the corresponding input wire of the input wires $IW_1$-$IW_N$.

In one embodiment, the shift register circuit 910 receives a clock signal CLK from the scanning circuit 110 to shift the output electrical level based on the clock signal CLK.

Based on the above, the method for scanning a keyboard circuit in this disclosure may be applied to various types of keyboards, to achieve the effect for effectively scanning the keyboard and recognizing the pressed keys.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A method for scanning a keyboard circuit including a keyboard array including a plurality of key units, a plurality of output wires, a plurality of input wires, and a scanning circuit, wherein each of the plurality of output wires is electrically coupled to a corresponding column of key units of a plurality of columns of key units of the keyboard array, respectively, wherein each of the plurality of input wires is electrically coupled to a corresponding row of key units of a plurality of rows of key units of the keyboard array, and is provided with a pull-up resistor, respectively, wherein the scanning circuit is electrically coupled to each of the output wires through a corresponding open-drain transistor of a plurality of open-drain transistors, respectively, and the scanning circuit is electrically coupled to the input wires, the method comprising:

turning on the open-drain transistors and connecting the open-drain transistors to a ground by the scanning circuit in a charge-cleaning segment of a scanning interval to clean charges on the output wires;

only turning on the open-drain transistors and connecting the open-drain transistors to the ground by the scanning circuit during a respective independent scanning period in a scanning duration in an order of the plurality of columns of key units; and receiving a plurality of detected electrical levels through the input wires by the scanning circuit in the scanning duration, and when one of the detected electrical levels is substantially equal to an electrical level of the ground, determining a corresponding key unit of the key units that is pressed which electrically couples a corresponding output wire of the output wires and a corresponding input wire of the input wires.

2. The method of claim 1, wherein the scanning interval further comprises a non-charge-cleaning segment, wherein the charge-cleaning segment is prior to the non-charge-cleaning segment.

3. The method of claim 1, wherein the scanning interval further comprises a non-charge-cleaning segment, wherein the charge-cleaning segment is following the non-charge-cleaning segment.

4. The method of claim 1, wherein the keyboard array further comprises a plurality of ground key units arranged in one column, wherein each of the plurality of ground key units is electrically coupled between the corresponding input wire of the input wires and the ground, respectively, when pressed, the keyboard scanning method further comprising:

turning off the open-drain transistors by the scanning circuit in a first scanning segment of the scanning duration;

receiving a plurality of first detected electrical levels through the input wires by the scanning circuit in the first scanning segment, and when one of the first detected electrical levels is substantially equal to the electrical level of the ground, determining that the corresponding ground key unit of the ground key units is pressed;

only turning on the open-drain transistors and connecting the open-drain transistors to the ground by the scanning circuit during the respective independent scanning period in a second scanning segment of the scanning duration in the order of the plurality of columns of key units; and receiving a plurality of second detected electrical levels through the input wires by the scanning circuit in the second scanning segment, and when one of the second detected electrical levels is substantially equal to the electrical level of the ground and the corresponding ground key unit of the ground key units is not pressed, determining that a corresponding key unit of the key units is pressed.

5. The method of claim 1, wherein the keyboard array further comprises a plurality of power key units arranged in one column, wherein each of the plurality of power key units is electrically coupled between a corresponding input wire of the input wires and a power source, respectively, when pressed, and each of the input wires is provided with a pull-down resistor, respectively, the keyboard scanning method further comprising:

enabling the pull-up resistor and disabling the pull-down resistor, and only turning on the open-drain transistors and connecting the open-drain transistors to the ground during a respective independent scanning period in a first scanning segment of the scanning duration in the order of the plurality of columns of key units;

receiving a plurality of first detected electrical levels through the input wires by the scanning circuit in the first scanning segment, and when one of the first detected electrical levels is substantially equal to the electrical level of the ground, determining that a corresponding key unit of the key units is pressed;

disabling the pull-up resistor and enabling the pull-down resistor, and turning off the open-drain transistors in a second scanning segment of the scanning duration; and receiving a plurality of second detected electrical levels through the input wires by the scanning circuit in the second scanning segment, and when one of the second detected electrical levels is greater than a preset electrical level, determining that a corresponding power key unit of the power key units is pressed.

6. The method of claim 5, wherein the power key units are electrically coupled to the power source through a current-limiting resistor, a resistance ratio of the pull-down resistor to the current-limiting resistor is greater than a preset value, and the preset electrical level is determined by the resistance ratio.

7. The method of claim 1, wherein the keyboard circuit further comprises an external keyboard array comprising a plurality of external key units having the same number of rows and columns with the keyboard array, and wherein a first branch and a second branch of each of the output wires are electrically coupled to a corresponding column of key units of the key units and a corresponding column of external key units of the external key units, respectively, and each of the input wires is further electrically coupled to a corresponding row of external key units of a plurality of rows of external key units of the external keyboard array, and is provided with a pull-down resistor, respectively;

wherein the scanning circuit is further electrically coupled to each of the output wires through a corresponding open-source transistor of a plurality of open-source transistors, respectively, and a source of each of the open-source transistors is electrically coupled to a drain of a corresponding open-drain transistor of the open-drain transistors and a corresponding output wire of the output wires;

the keyboard scanning method further comprising:

enabling the pull-up resistor and disabling the pull-down resistor, disabling the open-source transistors by the scanning circuit, and only turning on the open-drain transistors and connecting the open-drain transistors to the ground during a respective independent first scanning period in a first scanning segment of the scanning duration in the order of the plurality of columns of key units;

receiving a plurality of first detected electrical levels through the input wires by the scanning circuit in the first scanning segment, and when one of the first detected electrical levels is substantially equal to the electrical level of the ground, determining that a corresponding key unit of the key units is pressed to electrically couple the first branch and a corresponding input wire of the input wires;

disabling the pull-up resistor and enabling the pull-down resistor, disabling the open-drain transistors by the scanning circuit, and only turning on the open-source transistors and connecting the open-source transistors to a power source during a respective independent second scanning period in a second scanning segment of the scanning duration in the order of the plurality of columns of external key units; and receiving a plurality of second detected electrical levels through the input wires by the scanning circuit in the second scanning segment, and when one of the second detected electrical levels is greater than a preset electrical level, determining that a corresponding external key unit of the external key units is pressed to electrically couple the second branch and the corresponding input wire of the input wires.

8. The method of claim 7, wherein the first branch of each of the output wires comprises a first diode comprising a first anode electrically coupled to the corresponding key unit of the key units and a first cathode electrically coupled to a corresponding open-drain transistor of the open-drain transistors;

wherein the second branch comprises a second diode comprising a second anode electrically coupled to a corresponding open-source transistor of the open-source transistors and a second cathode electrically coupled to a corresponding external key unit of the external key units.

9. The method of claim 1, wherein the keyboard circuit further comprises an external keyboard array comprising a plurality of external key units having the same number of rows with the keyboard array and a shift register circuit comprising a plurality of shift registers with an open-drain function electrically coupled to the plurality of columns of external key units correspondingly;

the keyboard scanning method further comprising:

only turning on the open-drain transistors and connecting the open-drain transistors to the ground by the scanning circuit during a respective independent first scanning period in a first scanning segment of the scanning duration in the order of the plurality of columns of key units;

receiving a plurality of first detected electrical levels through the input wires by the scanning circuit in the first scanning segment, and when one of the first detected electrical levels is substantially equal to the electrical level of the ground, determining that a corresponding key unit of the key units is pressed;

receiving an output electrical level of one of the output wires corresponding to a last row of key units by the shift register circuit;

shifting the output electrical level by the shift register circuit in a second scanning segment of the scanning duration in the order of the plurality of columns of external key units; and receiving a plurality of second detected electrical levels through the input wires by the scanning circuit in the second scanning segment, and when one of the second detected electrical levels is substantially equal to the electrical level of the ground, determining that a corresponding external key unit of the external key units is pressed to electrically couple the shift register circuit and a corresponding input wire of the input wires.

10. The method of claim 9, wherein the shift register circuit receives a clock signal from the scanning circuit to shift the output electrical level based on the clock signal.

* * * * *